(12) United States Patent
Nakazawa et al.

(10) Patent No.: US 9,892,919 B2
(45) Date of Patent: Feb. 13, 2018

(54) SEMICONDUCTOR DEVICE MANUFACTURING METHOD

(71) Applicant: FUJI ELECTRIC CO., LTD., Kawasaki-shi (JP)

(72) Inventors: Haruo Nakazawa, Matsumoto (JP); Masaaki Tachioka, Mutsumoto (JP); Naoto Fujishima, Matsumoto (JP); Masaaki Ogino, Matsumoto (JP); Tsunehiro Nakajima, Matsumoto (JP); Kenichi Iguchi, Matsumoto (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 76 days.

(21) Appl. No.: 14/682,692

(22) Filed: Apr. 9, 2015

(65) Prior Publication Data

US 2015/0214053 A1    Jul. 30, 2015

Related U.S. Application Data

(63) Continuation of application No. PCT/JP2013/073900, filed on Sep. 5, 2013.

(30) Foreign Application Priority Data

Oct. 23, 2012  (JP) ................. 2012-234232

(51) Int. Cl.
*H01L 21/28* (2006.01)
*H01L 21/04* (2006.01)
(Continued)

(52) U.S. Cl.
CPC ........ *H01L 21/0485* (2013.01); *H01L 21/268* (2013.01); *H01L 21/28568* (2013.01);
(Continued)

(58) Field of Classification Search
CPC ........... H01L 21/0485; H01L 29/66068; H01L 29/7802; H01L 29/7813; H01L 21/28568;
(Continued)

(56) References Cited

U.S. PATENT DOCUMENTS 6,110,813 A * 8/2000 Ota ................. H01L 21/0485
257/E21.062
6,744,008 B1    6/2004 Kasahara et al.
(Continued)

FOREIGN PATENT DOCUMENTS

CN    1868036 A    11/2006
EP    2388804 A1   11/2011
(Continued)

OTHER PUBLICATIONS

Office Action received in Chinese Patent Application No. 201380052480.X dated Jun. 30, 2016.

*Primary Examiner* — Vu A Vu
(74) *Attorney, Agent, or Firm* — Rabin & Berdo, P.C.

(57) ABSTRACT

A first nickel film is deposited inside a contact hole of an interlayer dielectric formed on an $n^+$-type SiC substrate. Irradiation with a first laser is carried out, forming an Ohmic contact with a silicon carbide semiconductor. A second nickel film and a front surface electrode film are deposited on the first nickel film, forming a source electrode. The back surface of the $n^+$-type SiC substrate is ground, and a third nickel film is formed on the ground back surface of the $n^+$-type SiC substrate. Irradiation with a second laser is carried out, forming an Ohmic contact with the silicon carbide semiconductor. A fourth nickel film and a back surface electrode film are deposited on the third nickel film, forming a drain electrode. By so doing, it is possible to (Continued)

prevent electrical characteristic deterioration of a semiconductor device, and to prevent warping and cracking of a wafer.

15 Claims, 15 Drawing Sheets

(51) Int. Cl.
    *H01L 21/268*     (2006.01)
    *H01L 21/285*     (2006.01)
    *H01L 21/321*     (2006.01)
    *H01L 21/324*     (2006.01)
    *H01L 29/66*     (2006.01)
    *H01L 29/78*     (2006.01)
    *H01L 21/304*     (2006.01)
    *H01L 29/16*     (2006.01)
    *H01L 29/739*     (2006.01)

(52) U.S. Cl.
    CPC ...... *H01L 21/28575* (2013.01); *H01L 21/321* (2013.01); *H01L 21/324* (2013.01); *H01L 29/66068* (2013.01); *H01L 29/7802* (2013.01); *H01L 29/7813* (2013.01); *H01L 21/304* (2013.01); *H01L 29/1608* (2013.01); *H01L 29/7395* (2013.01); *H01L 29/7397* (2013.01)

(58) Field of Classification Search
    CPC ................ H01L 21/321; H01L 21/324; H01L 21/28575; H01L 21/268; H01L 29/7397; H01L 29/7395; H01L 29/1608; H01L 21/304
    USPC .......................................................... 438/604
    See application file for complete search history.

(56) References Cited

U.S. PATENT DOCUMENTS

| | | | |
|---|---|---|---|
| 7,741,192 B2 | 6/2010 | Shimoyama et al. | |
| 8,039,279 B2* | 10/2011 | Chuang | H01L 33/40 438/28 |
| 8,502,345 B2 | 8/2013 | Nemoto et al. | |
| 8,679,882 B2 | 3/2014 | Okano | |
| 8,823,017 B2 | 9/2014 | Tamaso | |
| 2005/0104072 A1* | 5/2005 | Slater, Jr. | H01L 21/0485 257/77 |
| 2007/0066039 A1 | 3/2007 | Agarwal et al. | |
| 2007/0151963 A1* | 7/2007 | Tanaka | B23K 26/06 219/121.78 |
| 2008/0090369 A1* | 4/2008 | Akiyama | H01L 21/28518 438/308 |
| 2008/0206897 A1 | 8/2008 | Yoo et al. | |
| 2009/0194767 A1* | 8/2009 | Miura | H01L 21/32134 257/43 |
| 2011/0084270 A1* | 4/2011 | Yamazaki | H01L 29/7869 257/43 |
| 2011/0207321 A1 | 8/2011 | Fujiwara et al. | |
| 2011/0306188 A1 | 12/2011 | Kawai et al. | |
| 2012/0326167 A1 | 12/2012 | Tamaso | |
| 2013/0095603 A1 | 4/2013 | Cabal | |

FOREIGN PATENT DOCUMENTS

| | | |
|---|---|---|
| JP | H10-284436 | 10/1998 |
| JP | 2000-150875 A | 5/2000 |
| JP | 2001-144015 A | 5/2001 |
| JP | 2002-026341 A | 1/2002 |
| JP | 2005-243797 | 9/2005 |
| JP | 2006-156926 A | 6/2006 |
| JP | 2008-211177 | 9/2008 |
| JP | 2009-283754 | 12/2009 |
| JP | 2010-186991 A | 8/2010 |
| JP | 2011-159654 A | 8/2011 |
| JP | 2011-171551 A | 9/2011 |
| JP | 2011-187753 A | 9/2011 |
| JP | 2012-004185 A | 1/2012 |
| JP | 2012-099598 A | 5/2012 |
| JP | 2012-099599 | 5/2012 |
| JP | 2012-114480 | 6/2012 |
| JP | 2012-178603 | 9/2012 |
| WO | WO 2005-020308 A1 | 3/2005 |
| WO | WO-2011/111029 | 9/2011 |

* cited by examiner

SEMICONDUCTOR DEVICE MANUFACTURING METHOD

This application is a continuation under 35 U.S.C. 120 of International Application PCT/JP2013/073900 having the International Filing Date of Sep. 5, 2013, and having the benefit of the earlier filing date of Japanese Application No. 2012-234232, filed Oct. 23, 2012. All of the identified applications are fully incorporated herein by reference.

TECHNICAL FIELD

The present invention relates to a semiconductor device manufacturing method.

BACKGROUND ART

In recent years, reductions in size, and resistance when driven in high temperature environments, are being demanded of semiconductor devices. Together with this, research and development on semiconductor devices using silicon carbide (SiC) semiconductor bodies (hereafter referred to as silicon carbide semiconductor devices) instead of existing semiconductor devices using silicon (Si) semiconductor bodies is proceeding swiftly. Compared with silicon semiconductors, silicon carbide semiconductor devices have characteristics such that the melting point is higher, and the impurity diffusion coefficient is lower.

In order to fabricate (manufacture) a silicon carbide semiconductor device, it is necessary to, for example, form an Ohmic contact between a silicon carbide semiconductor and a metal electrode film, and to carry out high temperature annealing (high temperature heat treatment) at a temperature exceeding 1,000° C. in order to activate impurities introduced into the silicon carbide semiconductor. For example, furnace annealing using an annealing furnace, and rapid thermal annealing (RTA), are commonly known as annealing (contact annealing) for forming an Ohmic contact between a silicon carbide semiconductor and a metal electrode film.

A description will be given of an existing silicon carbide semiconductor device manufacturing method using furnace annealing or RTA, with an insulated gate field effect transistor (hereafter referred to as a SiC-MOSFET) as an example. FIGS. 10 to 15 are sectional views showing states partway through the manufacture of the existing SiC-MOSFET. Firstly, as shown in FIG. 10, an n⁻-type SiC epitaxial layer 102, which is to form an n⁻-type drift region, is grown on the front surface of an n⁺-type silicon carbide semiconductor substrate (hereafter referred to as an n⁺-type SiC substrate) 101, which is to form an n⁺-type drain region.

Next, as shown in FIG. 11, a p-type impurity is ion implanted, thereby selectively forming a p-type base region 103 in a surface layer of the n⁻-type SiC epitaxial layer 102. Next, as shown in FIG. 12, an n-type impurity ion implantation and a p-type impurity ion implantation are carried out sequentially, thereby selectively forming an n⁺-type source region 104 and a p⁺-type contact region 105 in a surface layer of the p-type base region 103. Next, the p-type base region 103, n⁺-type source region 104, and p⁺-type contact region 105 are activated using a high temperature annealing at in the region of 1,600° C.

Next, after wet oxidation at a temperature of 1,000° C. in an oxidizing atmosphere, the n⁻-type SiC epitaxial layer 102 surface is thermally oxidized by post-oxidation annealing (POA) at a temperature of in the region of 1,100° C. in a hydrogen (H₂) atmosphere, thereby forming a gate dielectric 106, as shown in FIG. 13. Next, patterning is carried out after depositing a polysilicon (poly-Si) film on the gate dielectric 106, thereby forming a gate electrode 107 across the gate dielectric 106 on a portion of the surface of the p-type base region 103 sandwiched by the n⁻-type drift region and n⁺-type source region 104.

Next, as shown in FIG. 14, an interlayer dielectric 108 of PSG (Phosphorus Silicon Glass) or the like is formed so as to cover the gate electrode 107. Next, annealing is carried out at a temperature of in the region of 800° C. for in the region of 10 minutes in order to smoothen (reflow) the interlayer dielectric 108. Next, the interlayer dielectric 108 is selectively removed by etching, thereby forming contact holes for obtaining source contact with the n⁺-type source region 104 and p⁺-type contact region 105.

Next, as shown in FIG. 15, a source electrode 109 that comes into contact with the n⁺-type source region 104 and p⁺-type contact region 105 via the contact holes is formed. Also, a drain electrode 110 is formed on the back surface of the n⁺-type SiC substrate 101 simultaneously with the source electrode 109. Next, contact annealing is carried out at a temperature of in the region of 1,000° C. for in the region of 2 minutes, thereby forming an Ohmic contact between the source electrode 109 and a silicon carbide semiconductor and between the drain electrode 110 and a silicon carbide semiconductor. A silicon carbide semiconductor refers to a semiconductor region formed in the n⁺-type SiC substrate 101 or n⁻-type SiC epitaxial layer 102.

Next, a one hour post-metallization annealing (PMA) is carried out at a temperature of 400° C., thereby improving the interface characteristics between the gate dielectric 106 and n⁺-type SiC substrate 101. Subsequently, next, a passivation film (not shown) is formed so as to cover the source electrode 109, thereby completing the SiC-MOSFET. Also, as another annealing to replace the heretofore described furnace annealing and RTA, research and development into laser annealing is being advanced.

A method whereby semiconductor element contact is formed by metal being formed on a silicon carbide substrate, an interface portion of the metal and SiC substrate being annealed, thereby forming a metal-SiC material there, and a certain place on the SiC substrate not being annealed, so that no metal-SiC material is formed there, has been proposed as a method of annealing a metal electrode film formed on an SiC substrate or SiC epitaxial layer using laser annealing (for example, refer to PTL 1).

Also, a method including a step of preparing a silicon carbide substrate having a substrate surface, a step of forming a gate dielectric so as to cover one portion of the substrate surface, a step of forming a contact electrode having Al atoms on the substrate surface so as to be in contact with and neighbor the gate dielectric, a step of forming an alloy having Al atoms by annealing the contact electrode with laser light, and a step of forming a gate electrode that covers one portion of the gate dielectric, has been proposed as another method (for example, refer to PTL 2).

CITATION LIST

Patent Literature

PTL 1: JP-A-2012-114480
PTL 2: JP-A-2012-099599

However, when carrying out high temperature annealing using furnace annealing or RTA, as heretofore described, there is a problem in that defects are excited in the n⁺-type SiC substrate 101 or n⁻-type SiC epitaxial layer 102. Also, when a SiC-MOSFET having a MOS gate (insulated gate formed of metal-oxide-semiconductor) structure, or the like, has a structure such that the gate dielectric 106 and contact electrode (source electrode 109) are in contact, the metal component of the contact electrode diffuses in the gate dielectric 106 when contact annealing is carried out, causing failure to occur.

Furthermore, the SiC-MOSFET manufacturing process is such that, as heretofore described, the source electrode 109 and drain electrode 110 are formed after the gate dielectric 106 and interlayer dielectric 108 are formed, after which contact annealing is carried out at in the region of 1,000° C. When this contact annealing is carried out using furnace annealing or RTA, the whole of the gate dielectric 106 formed in the previous step is heated at high temperature and deteriorates, and it is no longer possible to ensure adhesion between the gate dielectric 106 and silicon carbide semiconductor. Therefore, a drop in charging resistance, or the like, occurs, and problems such as a deterioration in gate threshold voltage (Vth) characteristics occur.

Also, when grinding the wafer back surface before forming the back surface electrode (drain electrode 110), thereby reducing the wafer thickness to in the region of, for example, 50 μm or less, in order to obtain a low-loss silicon carbide semiconductor device having breakdown voltage in the region of 3.3 kV, there is a problem in that the electrode melts when carrying out contact annealing using furnace annealing, stress is exerted on the wafer when the electrode is hardened again, and the wafer warps. Even when avoiding melting of the electrode by carrying out contact annealing using RTA, stress caused by grinding damage is exerted on the wafer after thinning, because of which wafer cracking occurs even with contact annealing at in the region of 1,000° C. for in the region of two minutes. Consequently, there is a problem in that wafer thinning is difficult.

Also, in PTL 1 and 2, it is disclosed that gate oxide deterioration is suppressed by using laser annealing, but there is no indication of effectiveness with respect to Vth characteristic deterioration. Furthermore, in PTL 1 and 2, it is mentioned only that heating of local regions is qualitatively possible, while there is no clear indication of a laser annealing optical system. For example, diligent research by the inventors has shown that, when forming a guard ring configuring a voltage resistant structure of a Schottky barrier diode (SBD) by impurity diffusion using laser annealing, an interlayer dielectric covering the voltage resistant structure deteriorates due to temperature rise caused by laser irradiation, and the desired breakdown voltage cannot be stably obtained.

SUMMARY

The invention, in order to resolve the problems of the heretofore described existing technology, has an object of providing a semiconductor device manufacturing method such that electrical characteristic deterioration can be prevented using a manufacturing method including heat treatment by laser irradiation. Also, the invention, in order to resolve the problems of the heretofore described existing technology, has an object of providing a semiconductor device manufacturing method such that wafer warping and cracking can be prevented using a manufacturing method including heat treatment by laser irradiation.

In order to resolve the heretofore described problems, thus achieving the objects of the invention, a semiconductor device manufacturing method according to an aspect of the invention has the following characteristics. Firstly, a dielectric formation step of forming a dielectric on a surface of a semiconductor substrate is carried out. Next, a step of selectively removing the dielectric, thereby selectively exposing the surface of the semiconductor substrate, is carried out. Next, an electrode film formation step of forming an electrode film on the exposed surface of the semiconductor substrate is carried out. Next, an annealing step of forming an Ohmic contact between the electrode film and semiconductor substrate by irradiating a pattern portion of the electrode film with a laser from the surface of the electrode film, thereby annealing a junction portion of the electrode film and semiconductor substrate, is carried out.

Also, the semiconductor device manufacturing method according to the heretofore described aspect of the invention is characterized in that the annealing step is such that the laser is concentrated through a lens, and irradiation with the laser is carried out in a state wherein the spot diameter of the laser is brought near the diffraction limit.

Also, the semiconductor device manufacturing method according to the heretofore described aspect of the invention is characterized in that the energy density of the laser is 1.6 J/cm² to 2.4 J/cm².

Also, the semiconductor device manufacturing method according to the heretofore described aspect of the invention is such that the dielectric and electrode film are formed on the front surface of the semiconductor substrate. Further, the semiconductor device manufacturing method is characterized by further including a thinning step of grinding the back surface of the semiconductor substrate, thereby reducing the thickness of the semiconductor substrate, after the electrode film formation step and before the annealing step.

Also, in order to resolve the heretofore described problems, thus achieving the objects of the invention, a semiconductor device manufacturing method according to an aspect of the invention is characterized in that a laser is concentrated through a lens, and a predetermined region of a semiconductor substrate is irradiated with the laser in a state wherein the spot diameter of the laser is brought near the diffraction limit, thereby annealing the predetermined region.

Also, the semiconductor device manufacturing method according to the heretofore described aspect of the invention is characterized in that the intensity of the laser is adjusted via a neutral density filter, and the predetermined region is irradiated with the laser in a state wherein the energy density of the laser is reduced.

Also, the semiconductor device manufacturing method according to the heretofore described aspect of the invention is characterized in that the semiconductor substrate is formed of silicon, silicon carbide, or gallium nitride.

According to the invention, a good Ohmic contact can be formed by a junction portion of the electrode film and semiconductor substrate being locally annealed by annealing using laser irradiation (heat treatment). Also, according to the invention, annealing is carried out locally using laser irradiation, because of which there is no annealing of the whole of the semiconductor substrate, as is the case with existing furnace annealing and RTA. Therefore, it is possible to suppress heating of the gate dielectric by first and second contact annealings carried out after the gate dielectric is formed. Consequently, it is possible to suppress deterioration of the gate dielectric, and thus possible to prevent deterioration of Vth characteristics.

Also, according to the invention, contact annealing for forming an Ohmic contact between the contact electrode and the semiconductor substrate is carried out on the lowermost thin electrode film configuring the contact electrode, because of which it is possible to prevent the detrimental effect of heat caused by contact annealing from spreading to regions other than the junction portion of the contact electrode and semiconductor substrate to a greater extent than when carrying out contact annealing on the existing thick contact electrode.

Also, according to the invention, after contact annealing of the lowermost thin electrode film configuring the contact electrode is carried out by localized laser irradiation, an electrode film is further formed on the thin electrode film and adopted as the contact electrode, because of which there is no melting of the contact electrode due to contact annealing. Therefore, stress exerted on the wafer (semiconductor substrate) is reduced even when contact annealing is carried out after the wafer is thinned, because of which warping and cracking of the wafer can be prevented.

Advantageous Effects of Invention

According to the semiconductor device manufacturing method according to the invention, an advantage is achieved in that electrical characteristic deterioration can be prevented using a manufacturing method including heat treatment by laser irradiation. Also, according to the semiconductor device manufacturing method according to the invention, an advantage is achieved in that wafer cracking can be prevented using a manufacturing method including heat treatment by laser irradiation.

DETAILED DESCRIPTION

Hereafter, referring to the attached drawings, a detailed description will be given of preferred embodiments of a semiconductor device manufacturing method according to the invention. In the specification and attached drawings, a layer or region being prefixed by n or p means that electrons or holes respectively are majority carriers. Also, + or − attached to n or p indicates a higher impurity concentration or lower impurity concentration respectively than in a layer or region to which + or − is not attached. In the following description of the embodiments and attached drawings, the same reference signs are attached to the same configurations, and redundant descriptions are omitted.

Embodiment 1

Figure 1:
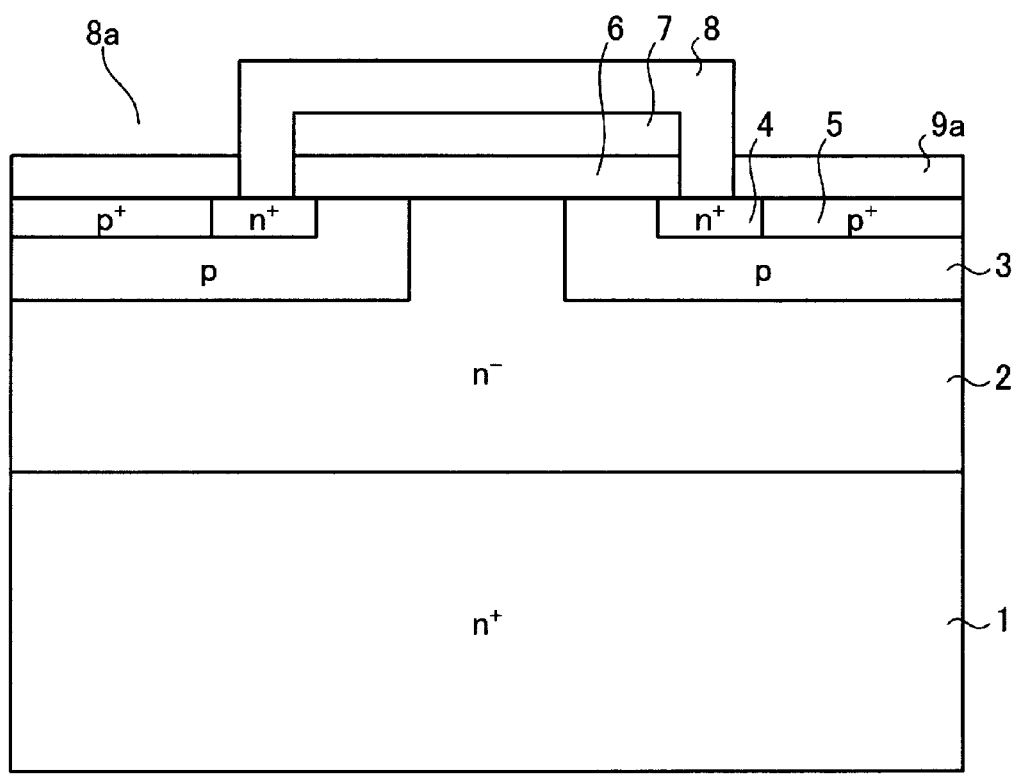
FIG. 1 is a sectional view showing a state partway through the manufacture of a semiconductor device according to Embodiment 1.

Firstly, a description will be given of a semiconductor device manufacturing method according to Embodiment 1, with a case of manufacturing a planar gate MOSFET as an example. FIGS. 1 to 6 are sectional views showing states partway through the manufacture of a semiconductor device according to Embodiment 1. Firstly, as shown in FIG. 1, an n⁻-type SiC epitaxial layer 2, which is to form an n⁻-type drift region, is grown on the front surface of an n⁺-type silicon carbide semiconductor substrate (n⁺-type SiC substrate) 1, which is to form an n⁺-type drain region. Hereafter, the surface on the n⁻-type SiC epitaxial layer 2 side of the semiconductor substrate formed of the n⁺-type SiC substrate 1 and n⁻-type SiC epitaxial layer 2 will be taken to be the front surface, while the surface on the n⁺-type SiC substrate 1 side will be taken to be the back surface.

Next, a planar gate type MOS gate structure formed of a p-type base region 3, n⁺-type source region 4, p⁺-type contact region 5, gate dielectric 6, and gate electrode 7 is formed on the n⁻-type SiC epitaxial layer 2 (substrate front surface side) using a general method. Next, an interlayer dielectric 8 of PSG or the like is formed so as to cover the gate electrode 7. Next, annealing (heat treatment) is carried out in order to smoothen (reflow) the interlayer dielectric 8. Next, the interlayer dielectric 8 is selectively removed by etching, thereby forming contact holes 8a for obtaining source contact with the n⁺-type source region 4 and p⁺-type contact region 5.

Figure 2:
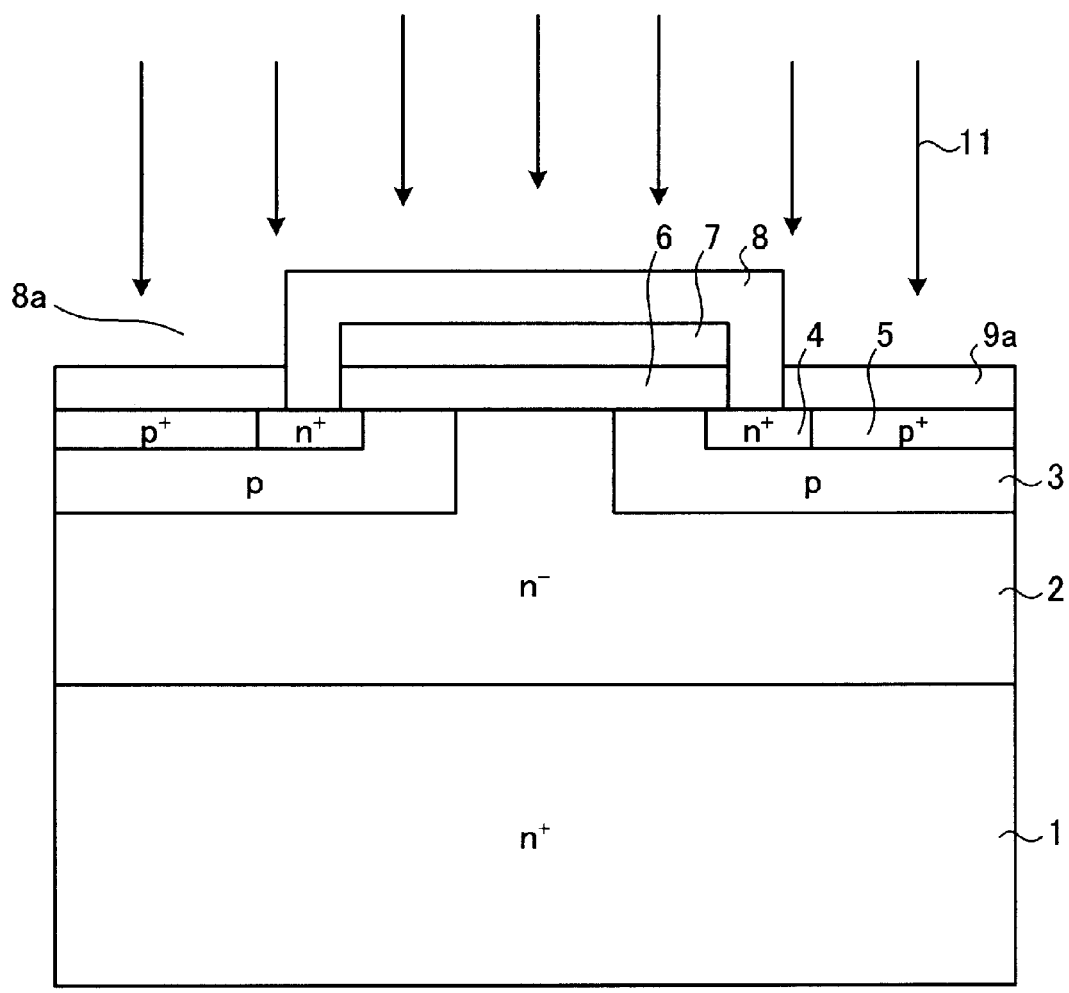
FIG. 2 is a sectional view showing a state partway through the manufacture of a semiconductor device according to Embodiment 1.

Next, a first nickel (Ni) film 9a, of a thickness of in the region of, for example, 50 nm, that forms a source contact is deposited inside the contact holes 8a so as to come into contact with the n⁺-type source region 4 and p⁺-type contact region 5. The thickness of the first nickel film 9a is taken to be 20 nm to 100 nm. Next, as shown in FIG. 2, irradiation with a first laser 11 is carried out from the whole of the interlayer dielectric 8 and first nickel film 9a, thereby locally annealing (first contact annealing) a junction portion of the first nickel film 9a and a silicon carbide semiconductor (for example, a C plane) at a temperature in the region of room temperature. By so doing, adhesion between the first nickel film 9a and silicon carbide semiconductor is secured, and an Ohmic contact is formed. The silicon carbide semiconductor is the n⁺-type source region 4 and p⁺-type contact region 5.

The energy density of the first laser 11 may be, for example, 0.4 J/cm² to 2.4 J/cm², and preferably in the region of 1.6 J/cm² to 2.0 J/cm². Also, the first laser 11 irradiation is carried out within a wavelength band such that reflection against the first nickel film 9a is not large. For example, a wavelength of 200 nm to a wavelength of 600 nm is good as the wavelength band. Further, in order that warping does not occur when annealing a thinned wafer, it is good when the overlapping rate is 70% or less. By carrying out irradiation from above the first nickel film 9a with the first laser 11 in this kind of wavelength band, the silicon carbide semiconductor surface becomes moderately rough. Therefore, adhesion with the thin first nickel film 9a improves, and an Ohmic contact can be formed. For example, a YAG laser or excimer laser may be used as the first laser 11.

Specifically, the irradiation with the first laser 11 may be at a pulse width of 100 ns using, for example, a YAG2ω laser (the second harmonic of a YAG laser, 532 nm wavelength). Also, when considering the silicon carbide semiconductor absorption characteristics, a YAG3ω laser (the third harmonic of a YAG laser, 355 nm wavelength) or XeCl excimer laser (a xenon chloride excimer laser, wavelength 308 nm) may be used as the first laser 11.

Figure 3:
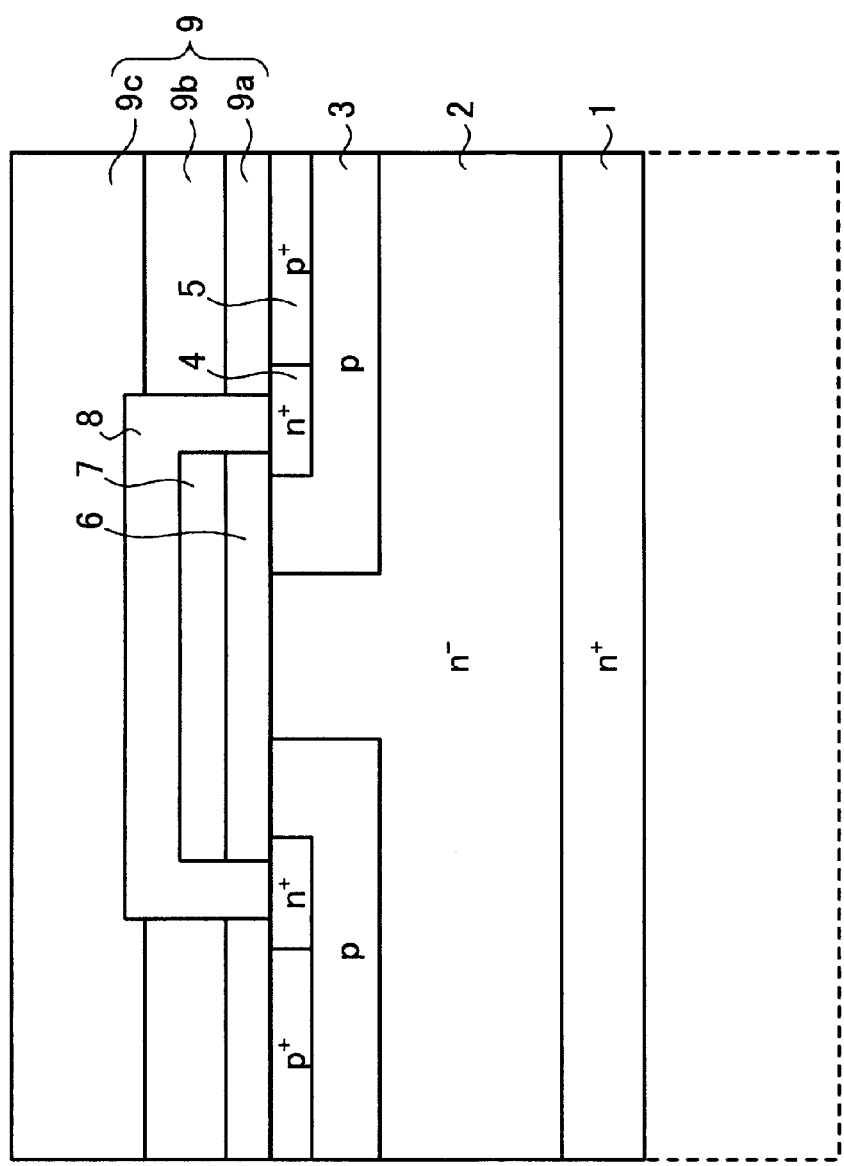
FIG. 3 is a sectional view showing a state partway through the manufacture of a semiconductor device according to Embodiment 1.

Next, as shown in FIG. 3, a second nickel film 9b of a thickness in the region of, for example, 500 nm is deposited on the first nickel film 9a. Further, a front surface electrode film 9c formed of aluminum-silicon (Al—Si) of a thickness in the region of, for example, 5 μm is further deposited on the second nickel film 9b. Next, annealing is carried out at a low temperature in the region of, for example, 380° C. for in the region of one hour. By so doing, a source electrode 9 formed by the first nickel film 9a, second nickel film 9b, and front surface electrode film 9c being stacked sequentially is formed. Next, the back surface of the $n^+$-type SiC substrate 1 is ground, whereby the thickness of the semiconductor substrate formed of the $n^+$-type SiC substrate 1 and $n^-$-type SiC epitaxial layer 2 becomes the desired thickness (Thinning).

Figure 4:
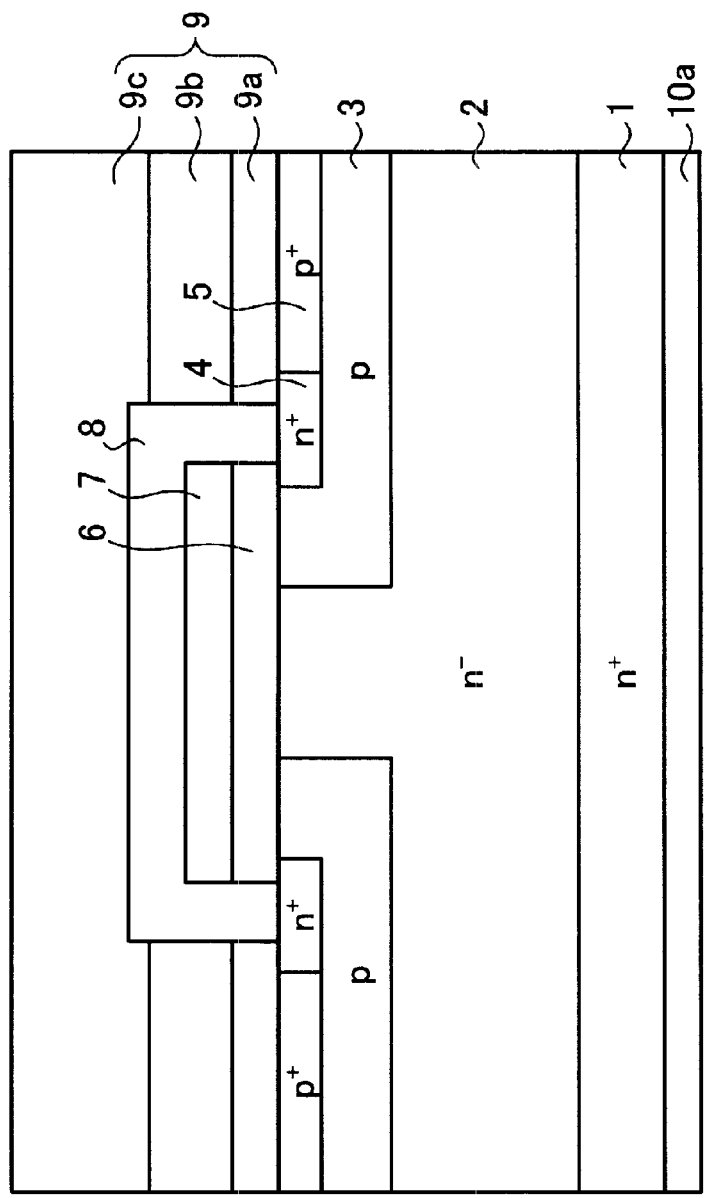
FIG. 4 is a sectional view showing a state partway through the manufacture of a semiconductor device according to Embodiment 1.
Figure 5:
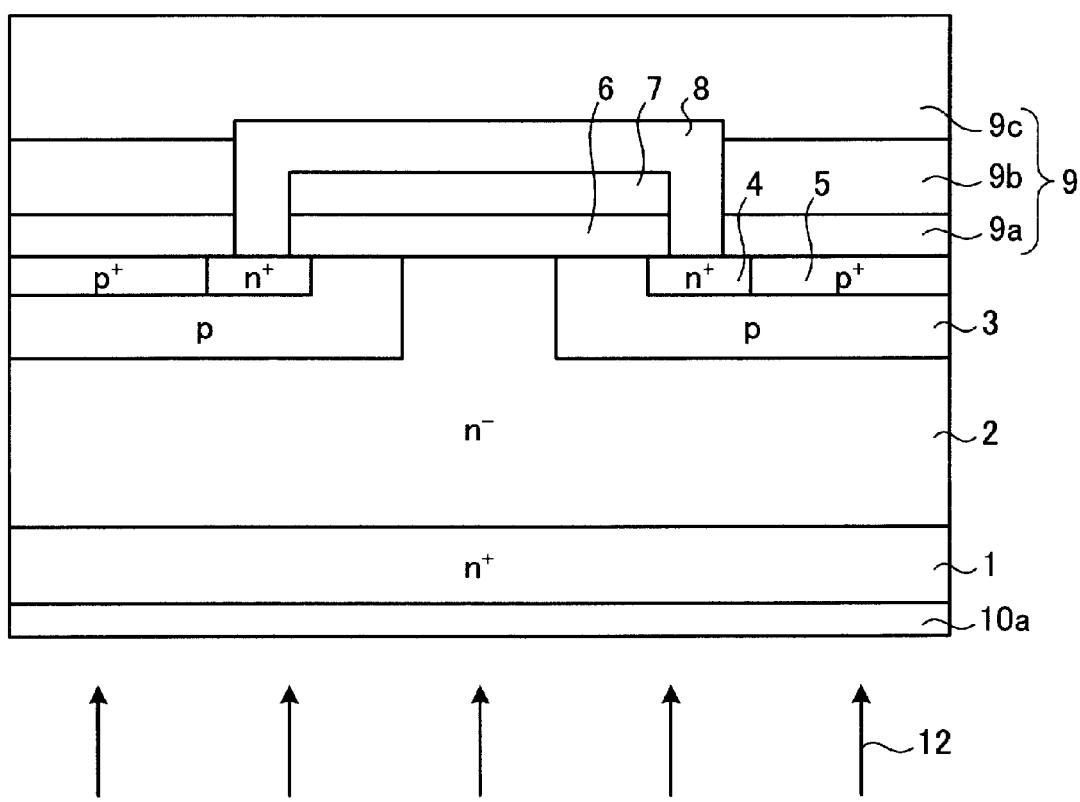
FIG. 5 is a sectional view showing a state partway through the manufacture of a semiconductor device according to Embodiment 1.

Next, as shown in FIG. 4, a third nickel film 10a of a thickness in the region of, for example, 50 nm that forms a drain contact is deposited on the ground back surface of the $n^+$-type SiC substrate 1. Next, as shown in FIG. 5, irradiation with a second laser 12 is carried out from the whole of the third nickel film 10a, thereby annealing (second contact annealing) a junction portion of the third nickel film 10a and a silicon carbide semiconductor at a temperature in the region of ambient temperature. By so doing, adhesion between the third nickel film 10a and silicon carbide semiconductor is secured, and an Ohmic contact is formed. The silicon carbide semiconductor is the back surface of the $n^+$-type SiC substrate 1. The kinds of second laser 12 and the irradiating conditions of the second laser 12 are, for example, the same as the kinds of first laser 11 and the irradiating conditions of the first laser 11.

Figure 6:
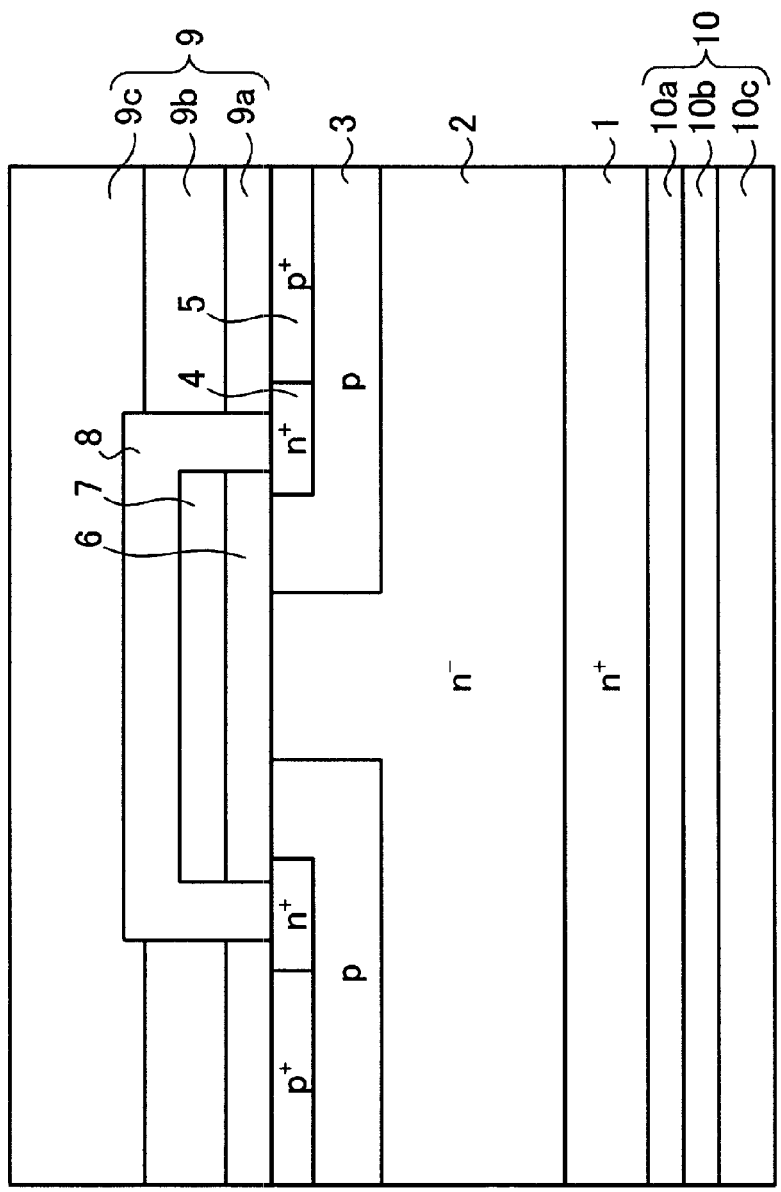
FIG. 6 is a sectional view showing a state partway through the manufacture of a semiconductor device according to Embodiment 1.

Next, as shown in FIG. 6, a fourth nickel film 10b of a thickness in the region of, for example, 500 nm is deposited on the third nickel film 10a. Further, aback surface electrode film 10c formed by, for example, a silicon film, a titanium (Ti) film, a nickel film, and a gold (Au) film being stacked sequentially is further deposited on the fourth nickel film 10b. Next, annealing is carried out at a low temperature in the region of, for example, 380° C. for in the region of one hour. By so doing, a drain electrode 10 formed by the third nickel film 10a, fourth nickel film 10b, and back surface electrode film 10c being stacked sequentially is formed, whereby the planar gate MOSFET is completed.

As heretofore described, according to Embodiment 1, a good Ohmic contact can be formed by a junction portion of the contact electrode and silicon carbide semiconductor being locally annealed by contact annealing using laser irradiation. Also, according to Embodiment 1, annealing is carried out locally using laser irradiation, because of which there is no annealing of the whole of the semiconductor substrate, as is the case with existing furnace annealing and RTA. Therefore, it is possible to suppress heating of the gate dielectric by the first and second contact annealings carried out after the gate dielectric is formed. Consequently, it is possible to prevent deterioration of the gate dielectric, and thus possible to prevent deterioration of Vth characteristics.

Also, according to Embodiment 1, contact annealing for forming an Ohmic contact between the contact electrode and the semiconductor substrate is carried out locally on the lowermost thin first nickel film configuring the contact electrode, because of which it is possible to prevent the detrimental effect of heat caused by contact annealing from spreading to regions other than the junction portion of the contact electrode and semiconductor substrate to a greater extent than when carrying out contact annealing on the existing thick contact electrode.

Also, according to Embodiment 1, after contact annealing of the lowermost thin first nickel film configuring the contact electrode is carried out by localized laser irradiation, the second nickel film and front surface electrode are further formed on the thin first nickel film and adopted as the contact electrode, because of which there is no melting of the contact electrode due to contact annealing. Therefore, stress exerted on the wafer is reduced even when contact annealing is carried out after the wafer is thinned, because of which warping and cracking of the wafer can be prevented. Also, according to Embodiment 1, no contact annealing using furnace annealing or RTA is carried out, because of which it is possible to avoid defects being excited in the semiconductor substrate.

Embodiment 2

Figure 7:
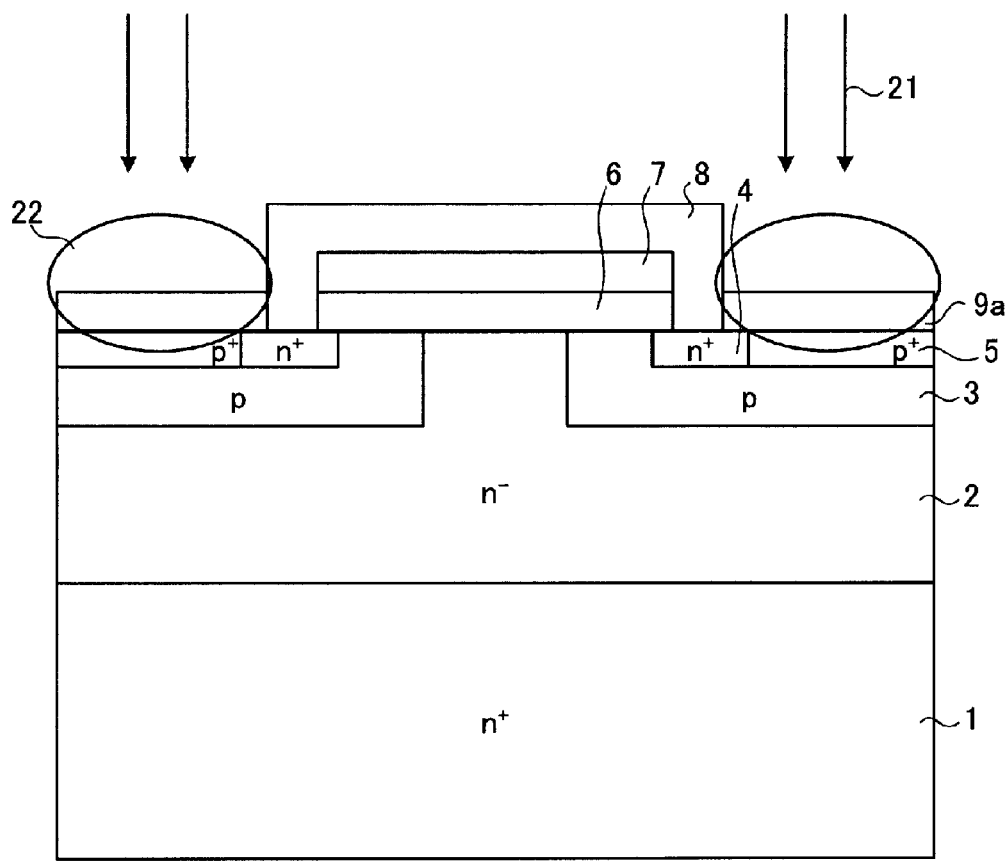
FIG. 7 is a sectional view showing a state partway through the manufacture of a semiconductor device according to Embodiment 2.

Next, a description will be given of a semiconductor device manufacturing method according to Embodiment 2. FIG. 7 is a sectional view showing a state partway through the manufacture of a semiconductor device according to Embodiment 2. The semiconductor device manufacturing method according to Embodiment 2 differs from the semiconductor device manufacturing method according to Embodiment 1 in that the first contact annealing is carried out by a planar pattern portion (the portion enclosed by reference sign 22) of the first nickel film 9a being irradiated with a first laser 21 from the first nickel film 9a surface.

Specifically, firstly, as shown in FIG. 7, the $n^-$-type SiC epitaxial layer 2 is grown on the $n^+$-type SiC substrate 1, after which the steps as far as the MOS gate structure, interlayer dielectric 8, and first nickel film 9a being formed on the $n^-$-type SiC epitaxial layer 2 are carried out, in the same way as in Embodiment 1. Next, irradiation with the first laser 21 is carried out from the first nickel film 9a surface, thereby locally annealing (first contact annealing) a junction portion of the first nickel film 9a and a silicon carbide semiconductor. That is, no irradiation with the first laser 21 is carried out from a portion other than the pattern portion of the first nickel film 9a. Therefore, adhesion between the first nickel film 9a and silicon carbide semiconductor can be secured without annealing anywhere other than the junction portion of the first nickel film 9a and silicon carbide semiconductor.

The first laser 21 is carried out using, for example, a laser annealing device that includes the function of an electron beam lithography device, and that can irradiate with an energy density (in the region of 1.6 J/cm² to 2.4 J/cm²)

higher than a normal energy density (in the region of several mJ/cm² to several tens of mJ/cm²). The function of an electron beam lithography device is, for example, a function whereby a target object (semiconductor substrate) mounted on a stage that can be moved in the X, Y, and Z directions (left-right and up-down directions) is laser irradiated in a predetermined pattern portion while the stage position is adjusted. For example, the laser annealing device reads a pattern of the first nickel film 9a stored in advance in a storage unit and, after carrying out positioning of the semiconductor substrate and the light source of the first laser 21 based on the relevant first nickel film 9a pattern, carries out irradiation of the pattern portion of the first nickel film 9a with the first laser 21 from the surface of the first nickel film 9a. Subsequently, by the subsequent steps being carried out sequentially in the same way as in the first embodiment, the planar gate MOSFET shown in FIG. 6 is completed.

As heretofore described, according to Embodiment 2, the same advantages as in Embodiment 1 can be obtained. Also, according to Embodiment 2, the first laser irradiation is carried out locally in the region in which the source contact is formed, because of which the first contact annealing is not performed on the gate dielectric, even when the first contact annealing is carried out after the formation of the gate dielectric. Consequently, adhesion between the contact electrode and semiconductor substrate is secured, and a good Ohmic contact is formed, in the desired region, and it is possible to provide a semiconductor device wherein there is no gate dielectric deterioration, that is, no Vth characteristic deterioration.

Embodiment 3

Figure 8:
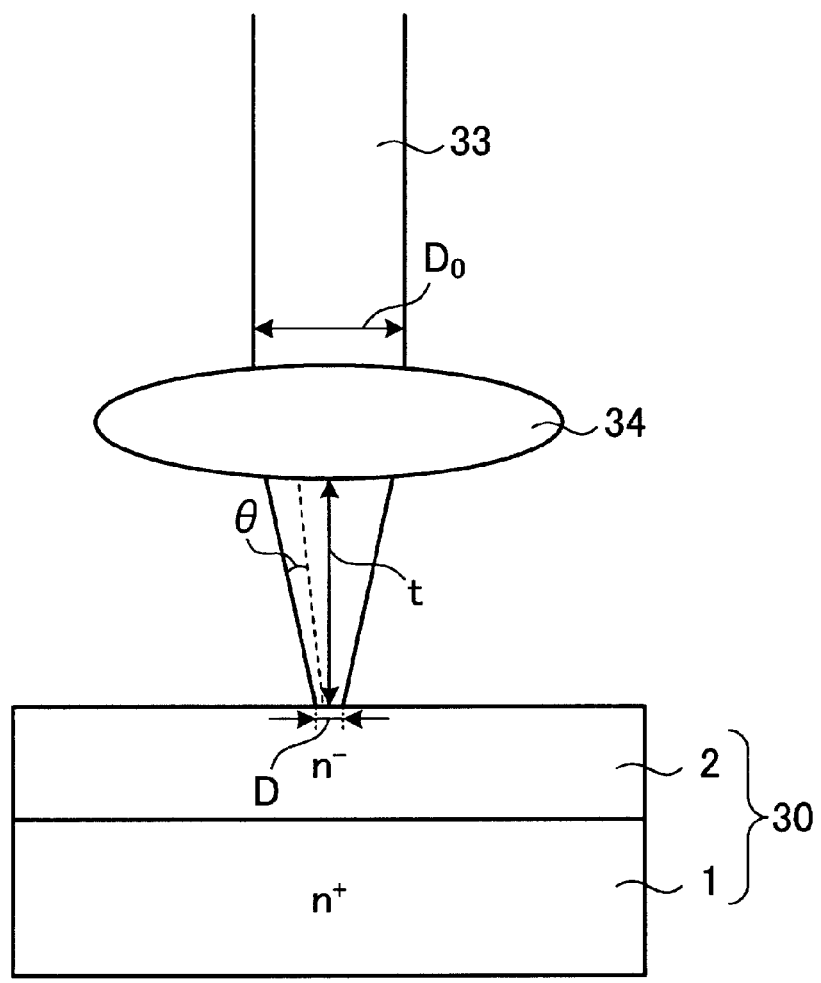
FIG. 8 is a sectional view schematically showing a state partway through the manufacture of a semiconductor device according to Embodiment 3.

Next, a description will be given of a semiconductor device manufacturing method according to Embodiment 3. FIG. 8 is a sectional view schematically showing a state partway through the manufacture of a semiconductor device according to Embodiment 3. The semiconductor device manufacturing method according to Embodiment 3 differs from the semiconductor device manufacturing method according to Embodiment 2 in that irradiation with a first laser 33 concentrated through a lens 34 is carried out from the first nickel film 9a surface. The region irradiated with the first laser 33 in FIG. 8 is, for example, a first nickel film (not shown). In FIG. 8, the front surface element structure of the MOS gate structure, and the like, formed on the substrate front surface side is omitted from the drawing.

Configurations other than the first laser 33 of the semiconductor device manufacturing method according to Embodiment 3 are the same as those of the semiconductor device manufacturing method according to Embodiment 2. Therefore, in Embodiment 3, a description will be given of only the configuration of the first laser 33. By the first laser 33 being concentrated through the lens 34, irradiation with the first laser 33 is carried out in a state concentrated within a spot diameter D, as shown in FIG. 8. At this time, the spot diameter D of the first laser 33 is reduced so that the spot diameter D of the first laser 33 nears the diffraction limit, and the energy of the first laser 33 is concentrated by the light path being adjusted. Therefore, the energy density drops in regions outside the portion in which the light is concentrated, because of which there is no silicification of the nickel. That is, localized silicification occurs only in the region in which the light is most concentrated, that is, the contact portion, with no effect on regions outside the contact portion.

The diffraction limit of the first laser 33 is determined by a wavelength λ, of the first laser 33 and the characteristics of the lens 34. Specifically, when the light wavelength is taken to be λ, and the numerical aperture of the lens 34 is taken to be $N_A$, a theoretical diffraction limit (resolution) d of the first laser 33 is expressed by the following Expression (1). The diffraction limit d corresponds to the minimum spot radius of the first laser 33 (the spot diameter D=2d).

$$d = 0.61 \cdot \lambda / N_A \qquad (1)$$

Also, when the angle with respect to the light axis of the first laser 33 concentrated by the lens 34 is taken to be θ, and the refractive index of the medium between a semiconductor substrate 30 formed of the n⁺-type SiC substrate 1 and n⁻-type SiC epitaxial layer 2 and the lens 34 is taken to be n, the numerical aperture $N_A$ of the lens 34 is expressed by the following Expression (2).

$$N_A = n \cdot \sin \theta \qquad (2)$$

By preparing the first laser 33 and lens 34 to satisfy the characteristics shown in Expressions (1) and (2), and to be appropriate to the design conditions of the semiconductor device to be manufactured, it is possible to selectively irradiate a desired microscopic region with the first laser 33 without using a laser mask. Also, the spot diameter D of the first laser 33 may by further optimized by the first laser 33 being passed through a plurality of the lens 34 with differing configurations. As an example, a laser having energy equal to or greater than the band gap of a silicon carbide semiconductor is used as the first laser 33. Specifically, it is good when, for example, a Nd:YAG3ω laser (the third harmonic of a neodymium-YAG laser, 355 nm wavelength) or XeCl excimer laser (wavelength 308 nm) is used as the first laser 33.

More specifically, for example, when taking the wavelength λ of the first laser 33 to be 308 nm, taking an incidence spot diameter $D_0$ of the first laser 33 before passing through the lens 34 to be 1 mm, and taking a focal length t of the lens 34 to be 6.4 mm, it is found from Expression (1) and Expression (2) that the spot diameter D of the first laser 33 is 4.8 μm (=2×0.61×308×10⁻³/sin (tan⁻¹ (0.5/6.4))). Consequently, it is possible to irradiate a desired microscopic region with the first laser 33 without using a laser mask, even in the case of a device designed to have an element structure of 10 μm or less. However, spread of the spot diameter D of the first laser 33 due to aberration is not taken into consideration (n=1).

Also, by a neutral density (ND) filter (not shown) being further provided between the light source of the first laser 33 and the semiconductor substrate 30, the intensity of the first laser 33 may be adjusted via the neutral density filter. By the intensity of the first laser 33 being adjusted via the neutral density filter, the energy density of the first laser 33 is reduced. Specifically, the incidence spot diameter $D_0$ of the first laser 33 is reduced to the spot diameter D by the lens 34. Further, the intensity of the first laser 33 is reduced by the ND filter to, for example, 1.6 J/cm² to 2.4 J/cm², which is an energy density appropriate to the first contact annealing. Therefore, it is possible to prevent the semiconductor substrate 30 surface from being etched (laser abrasion).

Another filter that can reduce the intensity of the first laser 33 may be used instead of the ND filter, or another filter that can reduce light intensity and the ND filter may be used in combination. Various changes in the energy density of the first laser 33 are possible in accordance with the object of annealing.

As heretofore described, according to Embodiment 3, it is possible to obtain the same advantages as in Embodiments 1 and 2. Also, according to Embodiment 3, it is possible to carry out annealing by laser irradiation without using a laser mask, because of which it is possible to improve throughput. Also, according to Embodiment 3, by adjusting the energy density of the laser by the appropriate use of the ND filter, it is possible to suppress temperature rise caused by laser irradiation when, for example, forming a guard ring configuring a voltage resistant structure of a Schottky barrier diode (SBD) by impurity diffusion using laser annealing, because of which it is possible to suppress deterioration of an interlayer dielectric covering the voltage resistant structure.

EXAMPLES

Figure 9:
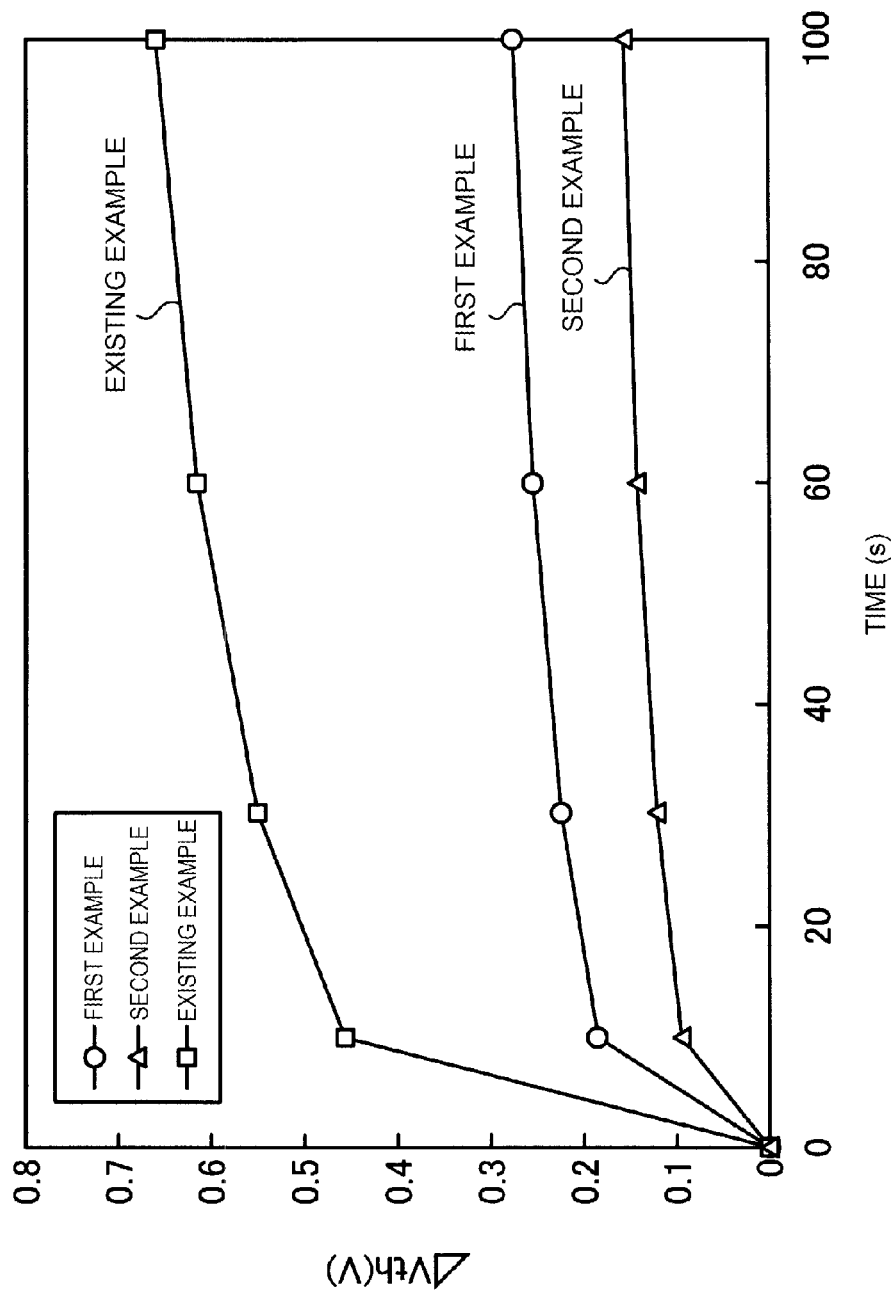
FIG. 9 is a characteristic diagram showing gate threshold voltage characteristics of semiconductor devices according to the invention.
Figure 10:
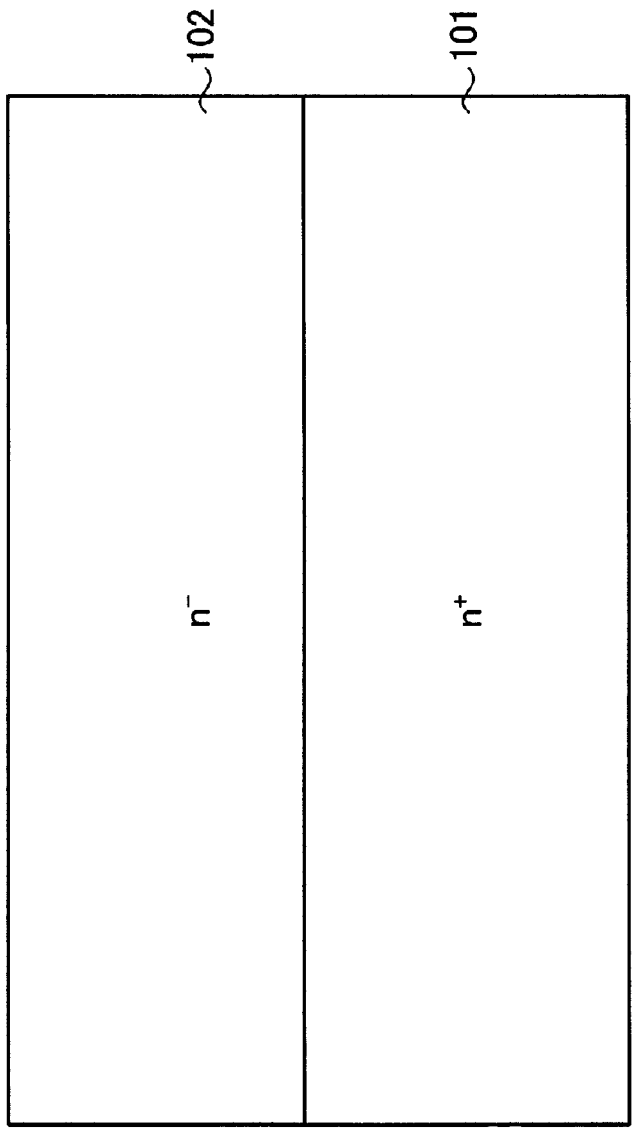
FIG. 10 is a sectional view showing a state partway through the manufacture of an existing SiC-MOSFET.
Figure 11:
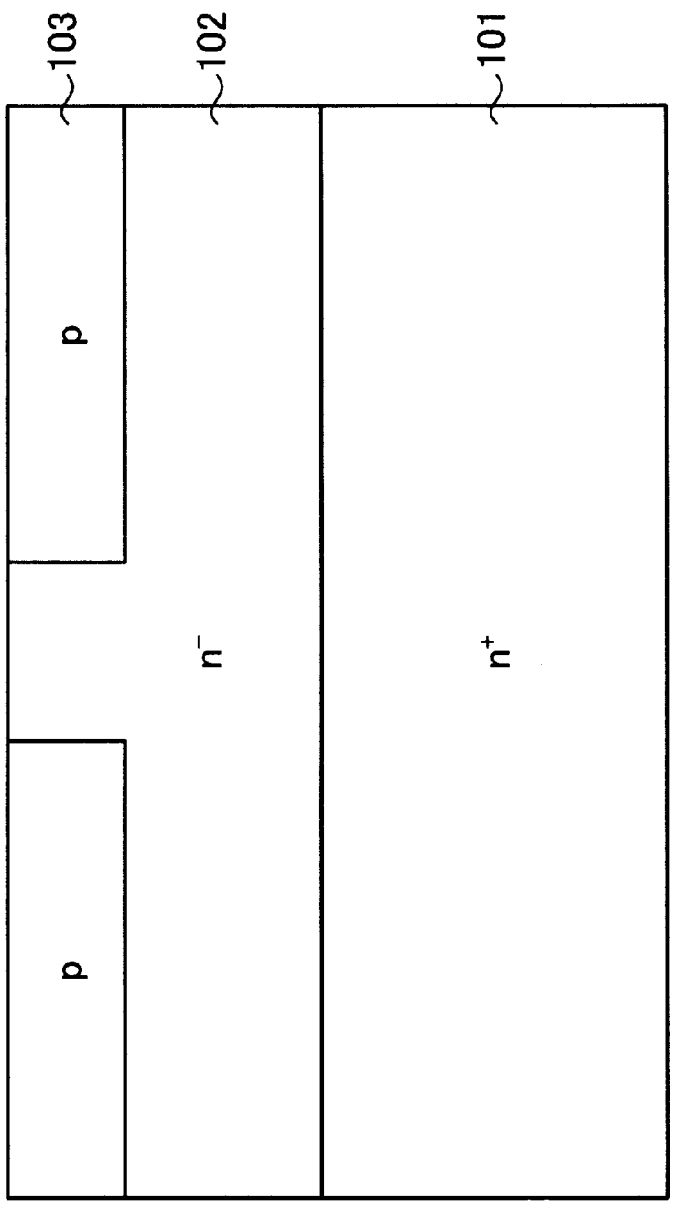
FIG. 11 is a sectional view showing a state partway through the manufacture of the existing SiC-MOSFET.
Figure 12:
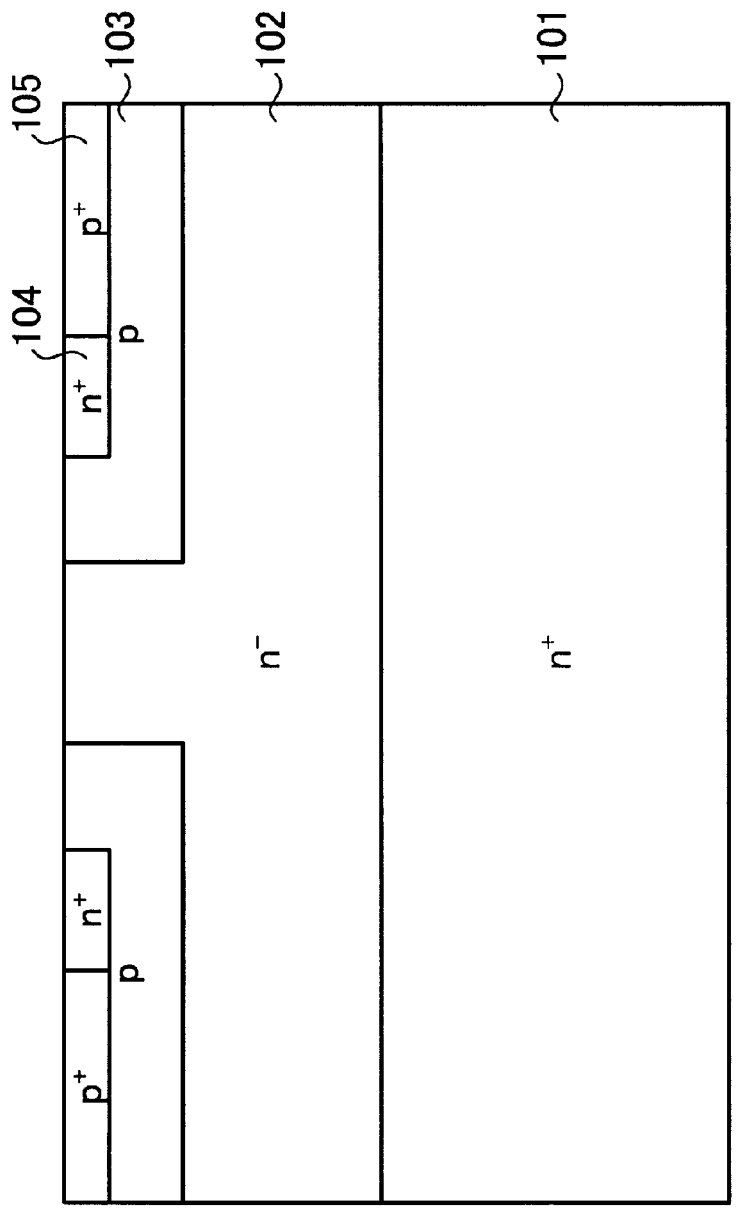
FIG. 12 is a sectional view showing a state partway through the manufacture of the existing SiC-MOSFET.
Figure 13:
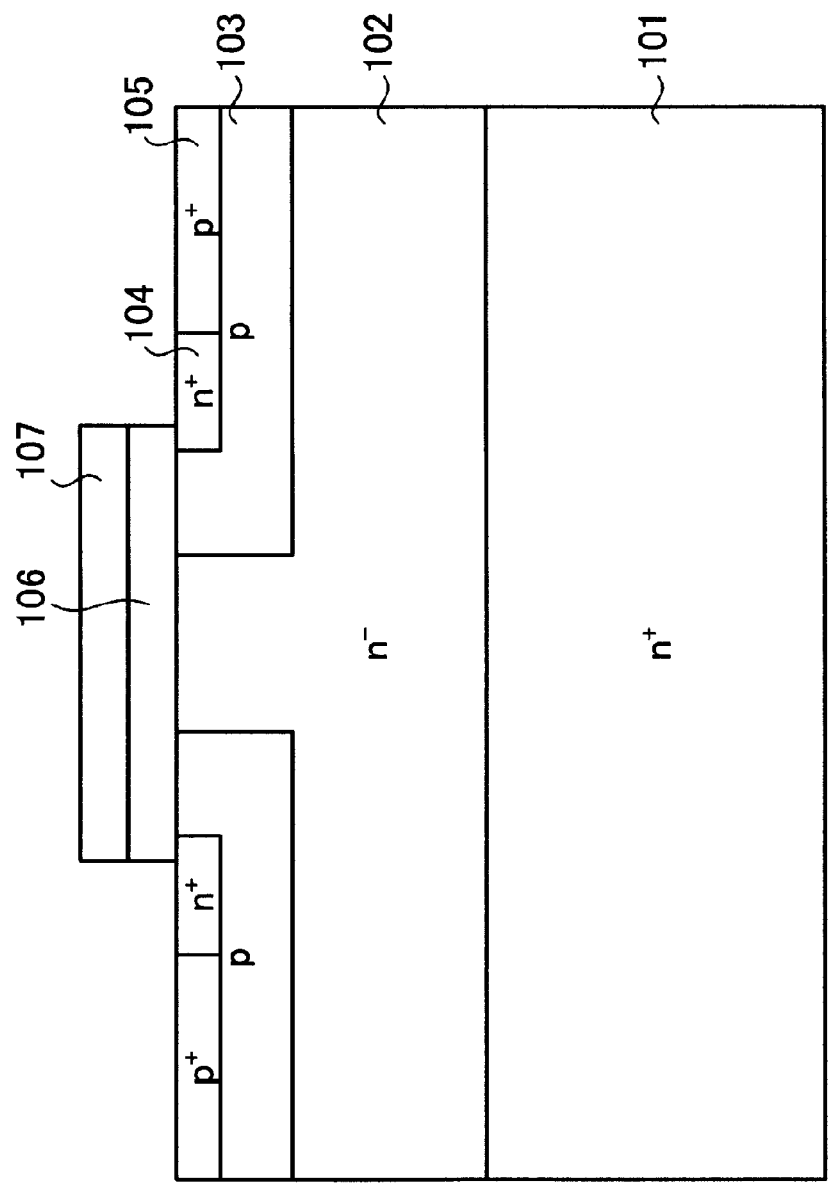
FIG. 13 is a sectional view showing a state partway through the manufacture of the existing SiC-MOSFET.
Figure 14:
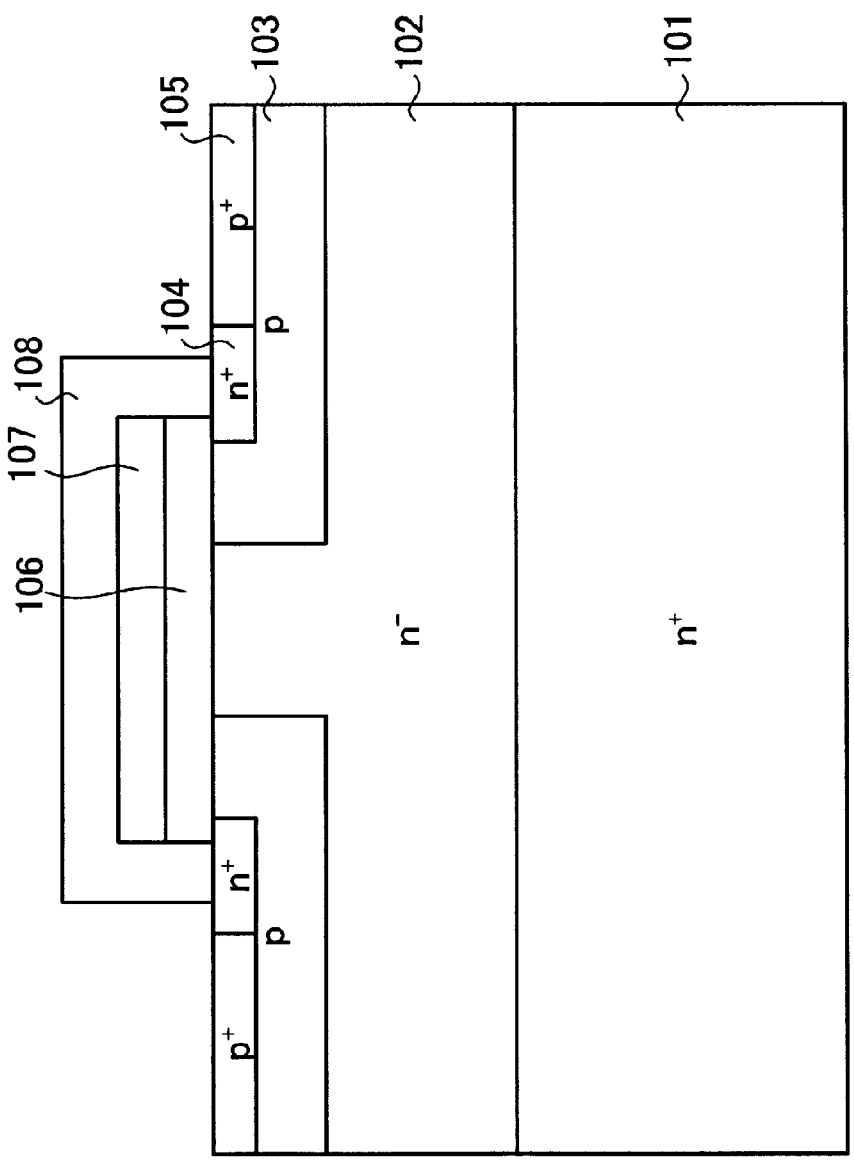
FIG. 14 is a sectional view showing a state partway through the manufacture of the existing SiC-MOSFET.
Figure 15:
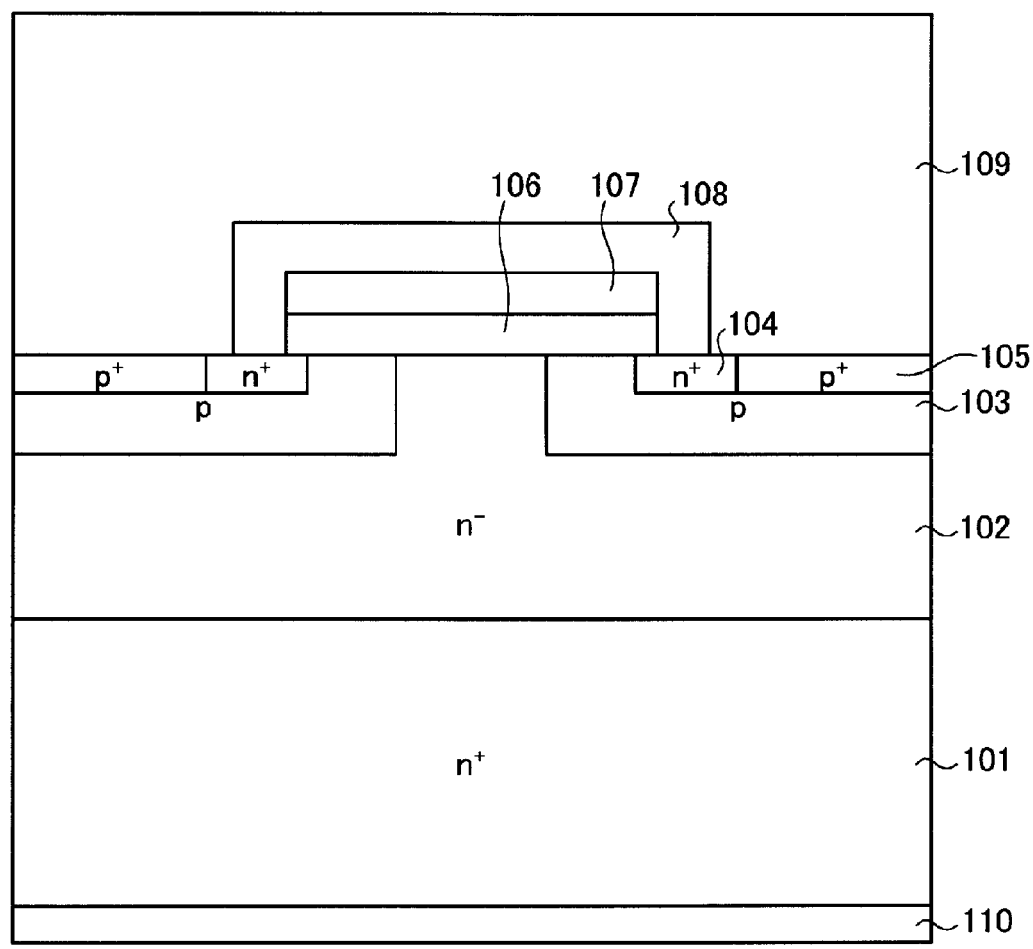
FIG. 15 is a sectional view showing a state partway through the manufacture of the existing SiC-MOSFET.

Next, verification of the Vth characteristics of the semiconductor device according to the invention is carried out. FIG. 9 is a characteristic diagram showing the gate threshold voltage characteristics of semiconductor devices according to the invention. Firstly, a SiC-MOSFET is fabricated in accordance with the semiconductor device manufacturing method according to Embodiment 1 (hereafter referred to as a first example). That is, in the first example, irradiation with the first laser 11 is carried out over the whole of the interlayer dielectric 8 and first nickel film 9a. Irradiation with the first and second lasers 11 and 12 is carried out at a pulse width of 100 ns using a YAG2ω laser (532 nm wavelength). The thickness of the first and third nickel films 9a and 10a is taken to be 50 nm, and the thickness of the second and fourth nickel films 9b and 10b is taken to be 500 nm. The breakdown voltage is taken to be 3.3 kV, and the thickness of the semiconductor substrate formed of the $n^+$-type SiC substrate 1 and $n^-$-type SiC epitaxial layer 2 is taken to be 50 μm. The gate threshold voltage Vth is taken to be +15V.

Also, a SiC-MOSFET is fabricated in accordance with the semiconductor device manufacturing method according to Embodiment 2 (hereafter referred to as a second example). That is, in the second example, irradiation with the first laser 21 is carried out in the pattern portion of the first nickel film 9a. Other conditions for fabricating the second example are the same as those of the first example. As a comparison, a SiC-MOSFET is fabricated in accordance with the existing semiconductor device manufacturing method shown in FIGS. 10 to 15 (hereafter referred to as an existing example). That is, in the existing example, a two minute contact annealing is carried out at a temperature of 1,000° C. using RTA. Also, in the existing example, no wafer thinning is carried out because warping and cracking occurs in the wafer when using RTA after wafer thinning, and the thickness of the semiconductor substrate formed of the $n^+$-type SiC substrate 101 and $n^-$-type SiC epitaxial layer 102 is greater than the thickness of the semiconductor substrate formed of the $n^+$-type SiC substrate 1 and $n^-$-type SiC epitaxial layer 2 of the first example. Configurations of the existing example other than the thickness of the $n^+$-type drift region are the same as those of the first example.

Then, a gate voltage of +15V is applied to the first and second examples and existing example in a room temperature (for example, 25° C.) environment, and a variation ΔVth of the gate threshold voltage is measured. The results of the measurements are shown in FIG. 9. The variation ΔVth of the gate threshold voltage is the difference between the measured gate threshold voltage Vth and a design gate threshold voltage $Vth_0$ in a MOSFET of the same structure (=$Vth-Vth_0$). From the results shown in FIG. 9, it is confirmed that the variation ΔVth of the gate threshold voltage in the existing example increases to in the region of 0.4V to 0.6V. As opposed to this, it is possible to suppress the variation ΔVth of the gate threshold voltage to in the region of 0.2V in the first example. In the second example, it is possible to suppress the variation ΔVth of the gate threshold voltage to in the region of 0.1V. Consequently, it is confirmed that variation ΔVth of the gate threshold voltage barely occurs in the first and second examples.

As heretofore described, the invention is such that various changes are possible, and in each of the heretofore described embodiments, for example, the irradiation conditions of the first and second lasers, the configuration conditions of the lens, and the like, are variously set in accordance with the required specifications and the like. Also, in each of the heretofore described embodiments, a description has been given with a contact annealing for forming an Ohmic contact between a metal film and a silicon carbide semiconductor as an example but, this not being limiting, the invention can be applied to an annealing for heating a localized microscopic region, or specifically, for example, an annealing for activating impurities introduced into the semiconductor substrate. Also, in each embodiment, a first conductivity type is taken to be an n-type and a second conductivity type is taken to be a p-type, but the invention is also established in the same way when the first conductivity type is taken to be a p-type and the second conductivity type is taken to be an n-type.

Also, in each embodiment, a description has been given using a SiC substrate but, this not being limiting, semiconductor substrates formed of various semiconductor materials that configure an electronic device, such as silicon or gallium nitride, may be used. Also, in each embodiment, a description has been given with a planar gate MOSFET as an example, but the invention is applicable to a device wherein an electrode is formed on each of the front surface and back surface of a semiconductor substrate. For example, the invention may be applied to a trench gate MOSFET instead of a planar gate type, or the invention may be applied to a FWD, IGBT, RB-IGBT, RC-IGBT, or RB type of MOSFET. For example, when fabricating an RB type of MOSFET, it is sufficient that a Schottky contact is formed by a titanium film that is to form a contact being formed after ensuring the flatness of the surface of a region in which a contact electrode is to be formed, and laser irradiation being carried out from above the titanium film.

INDUSTRIAL APPLICABILITY

As heretofore described, the semiconductor device manufacturing method according to the invention is useful for a power semiconductor device wherein high temperature annealing is needed.

REFERENCE SIGNS LIST

1 $n^+$-type SiC substrate
2 $n^-$-type SiC epitaxial layer
3 p-type base region
4 $n^+$-type source region
5 $p^+$-type contact region
6 Gate dielectric
7 Gate electrode
8 Interlayer dielectric
8a Contact hole
9 Source electrode
9a First nickel film 9b Second nickel film
9c Front surface electrode film
10 Drain electrode
10a Third nickel film
10b Fourth nickel film
10c Back surface electrode film
11, 21, 33 First laser
12 Second laser
30 Semiconductor substrate
34 Lens
D First laser spot diameter
$D_0$ First laser incidence spot diameter
d First laser spot diffraction limit
$N_A$ Lens numerical aperture
t Lens focal length

What is claimed is:

1. A semiconductor device manufacturing method, comprising:
    a dielectric formation step of forming a dielectric on a surface of a semiconductor substrate;
    a step of selectively removing the dielectric, thereby selectively exposing the surface of the semiconductor substrate;
    a first electrode film formation step of forming a first nickel electrode film of a thickness of 20 nm to 100 nm on the exposed surface of the semiconductor substrate;
    an annealing step of forming an Ohmic contact between the first nickel electrode film and semiconductor substrate by irradiating a pattern portion of the first nickel electrode film with a laser of a wavelength of 200 nm to 600 nm from a surface of the first nickel electrode film, thereby annealing a junction portion of the first nickel electrode film and semiconductor substrate;
    a second electrode film formation step of forming a second nickel electrode film on the first nickel electrode film;
    a third electrode film formation step of forming a front surface electrode film on the second nickel electrode film; and
    a source electrode formation step including carrying out another annealing step to form a source electrode film formed by the first nickel electrode film, the second nickel electrode film and the front surface electrode film.

2. The semiconductor device manufacturing method according to claim 1, wherein the annealing step is such that the laser is concentrated through a lens, and irradiation with the laser is carried out in a state wherein a spot diameter of the laser is brought near a diffraction limit.

3. The semiconductor device manufacturing method according to claim 1, wherein an energy density of the laser is 1.6 J/cm² to 2.4 J/cm², and an overlapping rate of the laser is 70% or less.

4. The semiconductor device manufacturing method according to claim 1, wherein the dielectric and first nickel electrode film are formed on a front surface of the semiconductor substrate, and
    the semiconductor device manufacturing method further comprises a thinning step of grinding a back surface of the semiconductor substrate, thereby reducing a thickness of the semiconductor substrate, after the annealing step.

5. The semiconductor device manufacturing method according to claim 1, wherein the semiconductor substrate is formed of silicon, silicon carbide, or gallium nitride.

6. The semiconductor device manufacturing method according to claim 2, wherein the dielectric and the first nickel electrode film are formed on a front surface of the semiconductor substrate, and
    the semiconductor device manufacturing method further comprises a thinning step of grinding a back surface of the semiconductor substrate, thereby reducing a thickness of the semiconductor substrate, after the annealing step.

7. The semiconductor device manufacturing method according to claim 3, wherein the dielectric and the first nickel electrode film are formed on a front surface of the semiconductor substrate, and
    the semiconductor device manufacturing method further comprises a thinning step of grinding a back surface of the semiconductor substrate, thereby reducing a thickness of the semiconductor substrate, after the annealing step.

8. The semiconductor device manufacturing method according to claim 2, wherein the semiconductor substrate is formed of silicon, silicon carbide, or gallium nitride.

9. The semiconductor device manufacturing method according to claim 3, wherein the semiconductor substrate is formed of silicon, silicon carbide, or gallium nitride.

10. The semiconductor device manufacturing method according to claim 4, wherein the semiconductor substrate is formed of silicon, silicon carbide, or gallium nitride.

11. A method, comprising:
    forming a first electrode film of a thickness substantially between 20 nm and 100 nm on a portion of a semiconductor device corresponding to a source;
    annealing a junction portion between the first electrode film and a substrate of the semiconductor device by selectively irradiating the first electrode film with radiation having a wavelength substantially between 200 nm and 600 nm;
    forming a second electrode film on the first electrode film;
    forming a front surface electrode film on the second electrode film; and
    annealing to form a source electrode from the first electrode film, the second electrode film and the front surface electrode film.

12. The method of claim 11, wherein the selectively irradiating comprises concentrating the radiation to form a spot of a predetermined diameter on the first electrode film.

13. The method of claim 12, wherein the predetermined diameter is based on a diffraction limit.

14. The method of claim 13, wherein the concentrating the radiation comprises passing the radiation through a lens, and the diffraction limit is based at least partly on characteristics of the lens.

15. The method of claim 11, wherein the first electrode film is formed in a contact hole of an interlayer dielectric.

* * * * *